United States Patent
Kiuchi et al.

(10) Patent No.: US 6,641,937 B1
(45) Date of Patent: Nov. 4, 2003

(54) TRANSPARENT CONDUCTIVE FILM AND PROCESS FOR PRODUCING THE FILM

(75) Inventors: Masato Kiuchi, Ikeda (JP); Kensuke Murai, Ikeda (JP); Shigeharu Tamura, Ikeda (JP); Norimasa Umesaki, Ikeda (JP); Jiro Matsuo, Kyoto (JP); Isao Yamada, Himeji (JP)

(73) Assignee: Agency of Industrial Science and Technology, Tokyo (JP)

( * ) Notice: Subject to any disclaimer, the term of this patent is extended or adjusted under 35 U.S.C. 154(b) by 89 days.

(21) Appl. No.: 09/710,482

(22) Filed: Nov. 9, 2000

(30) Foreign Application Priority Data

Nov. 11, 1999 (JP) .............................. 11-320431

(51) Int. Cl.$^7$ ............................... B32B 15/00
(52) U.S. Cl. .................. 428/697; 428/1.4; 428/432; 428/689; 428/698; 428/702; 428/704; 427/108; 427/109; 427/110; 427/126.1; 427/126.2; 427/126.3; 427/164; 427/165; 427/168; 427/169
(58) Field of Search ................. 428/432, 697, 428/698, 702, 1.4, 689, 704; 427/164, 165, 168, 169, 108, 109, 110, 126.1, 126.2, 126.3

(56) References Cited

U.S. PATENT DOCUMENTS 6,329,044 B1 * 12/2001 Inoue et al. ................ 428/209

FOREIGN PATENT DOCUMENTS

| JP | 03-110716 | | 5/1991 | |
|----|-----------|--|--------|--|
| JP | 04308612  | * | 10/1992 | ............ H01B/5/14 |
| JP | 06-041723 | | 2/1994 | |
| JP | 06081128 A | | 3/1994 | |

OTHER PUBLICATIONS

"Plasmareinigen Und—Vorbehandeln: Entwicklungsstand Und Trends, Teil 1" by Heinrich Grünwald, Hanau und Gabriele Stipan, Filderstadt, Metalloberfläche 48 (1994) 9, pp. 615–622 (except pp. 617, 619 and 620), including translation thereof. (no month).

* cited by examiner

Primary Examiner—Deborah Jones
Assistant Examiner—Andrew T Piziali
(74) Attorney, Agent, or Firm—Knobbe, Martens, Olson & Bear, LLP

(57) ABSTRACT

The present invention is for a transparent conductive film of nitrogen-containing indium tin oxide 5 nm to 100 $\mu$m thick formed on a substrate. The process for producing the transparent film includes exciting the surface of the substrate in a vacuum and depositing vaporized indium tin oxide on the surface of the substrate. The surface may be excited with irradiation with an ion beam. The indium tin oxide may be deposited through vacuum deposition, laser abrasion, ion plating, ion beam deposition, or chemical vapor deposition. Vapor deposition of indium tin oxide may be performed using a sintered product of indium oxide and tin oxide or with indium metal and tin metal.

13 Claims, No Drawings

TRANSPARENT CONDUCTIVE FILM AND PROCESS FOR PRODUCING THE FILM

FIELD OF THE INVENTION

The present invention relates to a transparent conductive film and a process for producing the film.

BACKGROUND OF THE INVENTION

Transparent conductive films are used as an electrode for driving liquid crystal serving as a display element for an information terminal in a computer, a portable telephone or the like. Indium tin oxide is mostly used as the raw material for such film. However, there is a demand for production of transparent conductive film of lower resistance to realize a more high-speed and finer display element.

Reportedly the lowest resistivity of transparent conductive films ever produced is $1 \times 10^{-4}$ Ωcm. In other words, the prior art technologies were unable to produce a transparent conductive film having a resistivity as low as $5 \times 10^{-5}$ Ωcm which is the desired resistivity of future display elements.

SUMMARY OF THE INVENTION

A principal object of the present invention is to provide a transparent conductive film having a lower resistivity than conventional transparent conductive films.

In view of the foregoing level of prior art technologies, the present inventors conducted extensive research and found that a film composed of indium tin oxide containing a small amount of nitrogen shows a low resistivity and can be used as an excellent transparent conductive film. Based on this novel finding, the inventors completed the present invention.

The present invention provides the following transparent conductive films and processes for producing the same.

1. A transparent conductive film of 5 nm to 100 μM in thickness comprising nitrogen-containing indium tin oxide formed on a substrate.
2. The transparent conductive film as defined in item 1 which has a nitrogen content of 0.01 to 10 atom %.
3. The transparent conductive film as defined in item 2 which has a nitrogen content of 1 to 5 atom %.
4. A process for producing a transparent conductive film, the process comprising the step of depositing vaporized indium tin oxide on the surface of a substrate which is led to a state of being excited in a vacuum.
5. The process as defined in item 4, wherein the surface of the substrate is excited by irradiation with an ion beam.
6. The process as defined in item 5, wherein the surface of the substrate is excited by irradiation with a nitrogen-containing oxygen ion beam.
7. The process as defined in item 6, wherein the irradiation is conducted with a nitrogen-containing oxygen ion beam, the nitrogen content being 0.1 to 30 atom %.
8. The process as defined in item 5, wherein the irradiation is conducted with a nitrogen-containing oxygen cluster ion beam, the cluster containing 0.1 to 30 atom % of nitrogen.
9. The process as defined in item 4, wherein the vapor deposition of indium tin oxide is performed by any of vacuum deposition method, laser abrasion method, ion plating method, ion beam deposition method and CVD method.
10. The process as defined in item 9, wherein the vapor deposition of indium tin oxide is performed using a sintered product of indium oxide and tin oxide.
11. The process as defined in item 9, wherein the vapor deposition of indium tin oxide is performed using metal indium and metal tin.

DETAILED DESCRIPTION OF THE INVENTION

The statement "the surface of a substrate is led to a state of being excited" used herein refers to the state of substrate surface in which after irradiation with an ion beam of 0.1 or more mW/m$^2$ in the density of energy flowing into the substrate surface to be irradiated, the substrate surface is given greater thermal motion energy or greater internal energy than before irradiation.

In the present invention, there is no limitation on materials for the substrate on which the transparent conductive film is formed. Useful materials include, for example, silicon wafers, glasses, ceramics, organic polymers and the like.

Useful glasses include, for example, oxide glasses, and preferred glasses include silicate glass, borosilcate glass, alkali glass, etc.

Useful ceramics include, for example, crystalline oxide ceramics, and preferred ceramics include alumina, magnesia zirconia, etc.

Useful organic polymers include, for example, polyimide, polyethylene, polyvinyl, etc., and preferred organic polymers include polymethyl methacrylate, polyimide, etc.

Among these materials, borosilicate glass is more preferred.

The transparent conductive film formed on the substrate according to the invention is composed of nitrogen-containing indium tin oxide. The nitrogen content is usually about 0.01 to about 10 atom %, preferably about 1 to about 5 atom %. The transparent conductive film usually has a thickness of about 5 nm to about 100 um, preferably about 10 nm to about 1 μm. When the film is too thin, the film used as an electrode shows a high electrical resistance and is unsuitable for use. On the other hand, if the film is too thick, the film absorbs light to a more extent and is insufficient in transparency.

The transparent conductive film of the invention may be produced as explained below.

First, the surface of the substrate for forming the film is led to a state of being excited. To excite the substrate surface, the surface may be irradiated with an ion beam in the conventional manner. The irradiation conditions can be suitably selected according to the kind of substrate, desired film thickness and the like.

For excitation of substrate surface, use can be made of at least one of inert gases such as helium, neon, argon and krypton or at least one of ions of carbon, nitrogen, oxygen and nitrogen oxide. When an oxygen ion, a nitrogen ion or a nitrogen oxide ion is not used as the ion forming a beam, it is preferred to supply oxygen, nitrogen or nitrogen oxide over the substrate surface at the site of reaction to form the atmosphere. More preferably the ions of ion beam are not single-atom ions but multi-atom ions or cluster ions. The accelerating voltage of ion beam is not limited but is usually about 10 eV higher.

After excitation of substrate surface, vaporized indium and tin are deposited on the substrate surface excited in the above-mentioned manner to form a transparent conductive film. The vapor deposition can be conducted concurrently with the excitation of substrate surface.

The vapor deposition of indium and tin can be carried out by conventional film-forming methods such as resistance heating method, electron beam method, laser abrasion method, ion plating method, ion beam deposition method and CVD method. In the present invention, the formation of film can be accelerated by introducing oxygen, nitrogen, nitrogen oxide or the like into the vacuum in the film-forming operation.

Nitrogen can be introduced into indium tin oxide in the present invention by incorporation of nitrogen in at least one of the stage of exciting the substrate surface and the stage of vapor deposition.

EFFECT OF THE INVENTION

According to the present invention, a transparent conductive film having a resistivity as low as $5 \times 10^{-5}$ $\Omega$cm or less can be obtained.

Such transparent conductive film is very useful, for example, as an electrode for driving liquid crystal widely used as a display element.

DESCRIPTION OF THE PREFERRED EMBODIMENTS

The features of the present invention will be further clarified with reference to the following examples and comparative example.

EXAMPLE 1

A substrate of solidified molten quartz was irradiated in a vacuum with a 10% nitrogen-containing oxygen cluster ion beam at 7 kV in the accelerating voltage of ion beam and 170 mA/cm$^2$ in the current density of ion beam. A vapor of indium tin oxide was deposited on the substrate surface kept at 100° C. by an electron beam method concurrently with the ion beam irradiation. The vapor deposition was carried out in an atmosphere consisting of 10% of nitrogen and 90% of oxygen under a pressure of $1 \times 10^{-5}$ Torr at a deposition rate of 0.1 nm/s for 1000 seconds. The deposited film had a thickness of 100 nm and contained 5 atom % of nitrogen.

The obtained film of nitrogen-containing indium tin oxide had an electrical conductivity of $5 \times 10^{-5}$ $\Omega$cm and a 95% permeability to light having a wavelength of 550 nm. Evidently the film is excellent in transparency and electrical conductivity.

COMPARATIVE EXAMPLE 1

A vapor of indium tin oxide was deposited on a solidified molten quartz substrate in a vacuum by an electron beam method. The vapor deposition was carried out on the substrate at 100° C. in an atmosphere consisting of 10% of nitrogen and 90% of oxygen under a pressure of $1 \times 10^{-5}$ Torr at a deposition rate of 0.1 nm/s for 1000 seconds. The deposited film had a thickness of 100 nm.

The obtained film of nitrogen-containing indium tin oxide had an electrical conductivity of $5 \times 10^{-2}$ $\Omega$cm and a 25% permeability to light having a wavelength of 550 nm. The film had a high resistivity and a low permeability to light. Therefore, the film can not be used as a transparent conductive film.

EXAMPLE 2

A substrate of aluminum oxide single crystal was irradiated in a vacuum with an ion beam derived from an ECR ion source at 3 kV in the accelerating voltage of ion beam and 0.1 mA/cm$^2$ in the current density of ion beam. A mixture of 5% of nitrogen and 95% of oxygen was supplied to the ECR ion source.

A vapor of indium and tin was deposited on the substrate surface at 150° C. by an electron beam heating method concurrently with the ion beam irradiation. The vapor deposition was carried out at a deposition rate of 1 nm/s for 500 seconds. The deposited film had a thickness of 500 nm and contained 3 atom % of nitrogen. The substrate was irradiated with an excimer laser at 50 mJ and 100 Hz concurrently with the vapor deposition.

The obtained film of nitrogen-containing indium tin oxide had an electrical conductivity of $5 \times 10^{-5}$ $\Omega$cm and a 93% permeability to light having a wavelength of 550 nm. Evidently the film is excellent in transparency and electrical conductivity.

What is claimed:

1. A transparent conductive film comprising nitrogen-containing indium tin oxide formed on a substrate, wherein said film is 0.5 nm to 100 μm thick; and said film has a resistivity of $5 \times 10^{-5}$ $\Omega$cm or less.

2. The transparent conductive film according to claim 1, wherein said film has a nitrogen content of 0.01 to 10 atom %.

3. The transparent conductive film according to claim 2, wherein said film has a nitrogen content of 1 to 5 atom %.

4. A process for producing a transparent conductive film on the surface of a substrate according to claim 1, the process comprising:

exciting the surface of the substrate in a vacuum; and depositing vaporized indium tin oxide on the surface of the substrate.

5. The process according to claim 4, wherein the surface of the substrate is excited by irradiating said surface with an ion beam.

6. The process according to claim 5, wherein the surface of the substrate is excited by irradiating said surface with a nitrogen-containing oxygen ion beam.

7. The process according to claim 6, wherein the nitrogen content of said nitrogen-containing oxygen ion beam is 0.1 to 30 atom %.

8. The process according to claim 5, wherein the ion beam is a nitrogen-containing oxygen cluster ion beam.

9. The process according to claim 4, wherein the vapor deposition of indium tin oxide is performed by a method selected from the group consisting of vacuum deposition, laser abrasion, ion plating, ion beam deposition and chemical vapor deposition.

10. The process according to claim 9, wherein the vapor deposition of indium tin oxide is performed using a sintered product of indium oxide and tin oxide.

11. The process according to claim 9, wherein the vapor deposition of indium tin oxide is performed using indium metal and tin metal.

12. The process according to claim 4, wherein said exciting is performed either concurrently with or prior to said depositing.

13. The process according to claim 8, wherein the clusters contain 0.1 to 30 atom % of nitrogen.

* * * * *

UNITED STATES PATENT AND TRADEMARK OFFICE
CERTIFICATE OF CORRECTION

PATENT NO. : 6,641,937 B1
DATED : November 4, 2003
INVENTOR(S) : Masato Kiuchi et al.

It is certified that error appears in the above-identified patent and that said Letters Patent is hereby corrected as shown below:

Title page,
Item [73], Assignee, insert -- Secretary, --, before "Agency"; and delete "Tokyo" and insert -- Tokyo-to -- therefor.

Signed and Sealed this

Fifteenth Day of November, 2005

JON W. DUDAS
*Director of the United States Patent and Trademark Office*